United States Patent [19]

Fujie

[11] 4,069,398

[45] Jan. 17, 1978

[54] METHOD AND APPARATUS FOR PILOT SIGNAL CANCELLATION IN AN FM MULTIPLEX DEMODULATOR

[75] Inventor: Seijiro Fujie, Tokyo, Japan

[73] Assignee: Pioneer Electronic Corporation, Tokyo, Japan

[21] Appl. No.: 719,629

[22] Filed: Sept. 1, 1976

[30] Foreign Application Priority Data

Sept. 2, 1975  Japan ................................. 50-106393

[51] Int. Cl.² .............................................. H04H 5/00
[52] U.S. Cl. .................................. 179/15 BT; 325/474
[58] Field of Search ......... 179/15 BT, 1 G, 100.4 ST; 325/36, 474, 481, 483

[56] References Cited

U.S. PATENT DOCUMENTS

| 3,617,641 | 11/1971 | Feit .................................. | 179/15 BT |
| 3,739,285 | 6/1973 | Hepp .................................. | 179/15 BT |
| 3,752,934 | 8/1973 | Nakamura et al. .............. | 179/15 BT |

*Primary Examiner*—Douglas W. Olms
*Attorney, Agent, or Firm*—Sughrue, Rothwell, Mion, Zinn and Macpeak

[57] ABSTRACT

Unwanted pilot signal components in the "L" and "R" outputs of a stereophonic FM multiplex demodulator are cancelled by inverting the 19KHz pilot signal, separately multiplying or gating it with the opposite phase 38KHz subcarrier signals, and adding the multiplier or gate outputs to the "L" and "R" demodulator outputs. The multiplication produces signals equal in amplitude but opposite in phase to the contaminating pilot signal components, whereby the latter are effectively cancelled by the addition function.

3 Claims, 11 Drawing Figures

METHOD AND APPARATUS FOR PILOT SIGNAL CANCELLATION IN AN FM MULTIPLEX DEMODULATOR

BACKGROUND OF THE INVENTION

This invention relates in general to FM multiplex (MPLX) demodulators, and more particularly to a method and apparatus for pilot signal cancellation in multiplex demodulators.

In the demodulation of an FM stereophonic signal in the pilot tone system, the 19 KHz pilot signal is extracted from the composite FM signal to be demodulated, and a subcarrier signal of 38 KHz is derived from the pilot signal. This subcarrier signal is employed as a switching signal in the demodulator so that stereophonic signals having right ("R") and left ("L") components are produced.

In a conventional FM multiplex demodulator, as shown in FIG. 1, a composite FM stereo signal is applied to terminal 1A, and opposite phase subcarrier signals are applied to terminals 1B and 1C, whereby "L" and "R" demodulation signals are produced at output terminals 1D and 1E, respectively.

When the pilot signal signal, FIG. 2(a), and the subcarrier signals FIG. 2(b) and FIG. 2(c) are applied to their respective input terminals, pilot signal components FIGS. 2(d) and 2(e), and containing harmonic components appear at the output terminals 1D and 1E, respectively. Accordingly, when the composite signal is demodulated merely by the subcarrier signals, the pilot signal contained in the composite signal remains in the demodulation outputs. These pilot signal components reduce the S/N ratio of the demodulated signal, and it is thus necessary to eliminate such components from the demodulated signal.

In conventional methods of eliminating the pilot signal components, a trap for blocking the pilot signal or a low pass filter is employed. However, these conventional methods adversely affect the high frequency (around 15 KHz) phase, amplitude and transmission characteristics of the demodulator outputs.

SUMMARY OF THE INVENTION

According to the present invention, and in order to avoid the drawbacks attendant with the prior art pilot signal component elimination techniques, a signal opposite in phase to the pilot signal is obtained and separately multiplied by the respective subcarrier signals, and the resulting multiplication signals are then added to the "L" and "R" output signals of the multiplex demodulator to effectively cancel the unwanted pilot signal components.

DETAILED DESCRIPTION OF THE INVENTION

Figure 1:
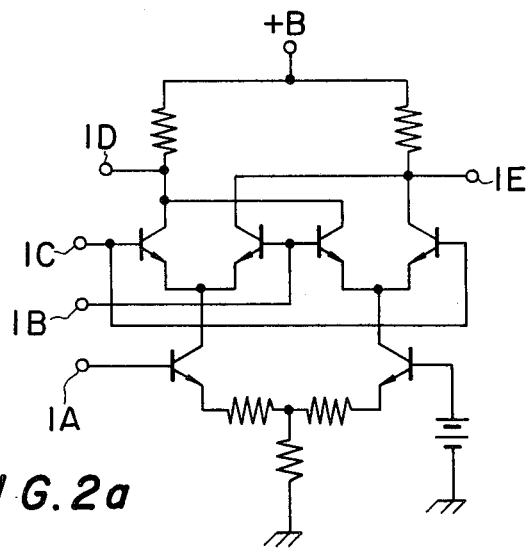
FIG. 1 shows a schematic circuit diagram illustrating a typical FM multiplex demodulator of the prior art.
Figure 3:
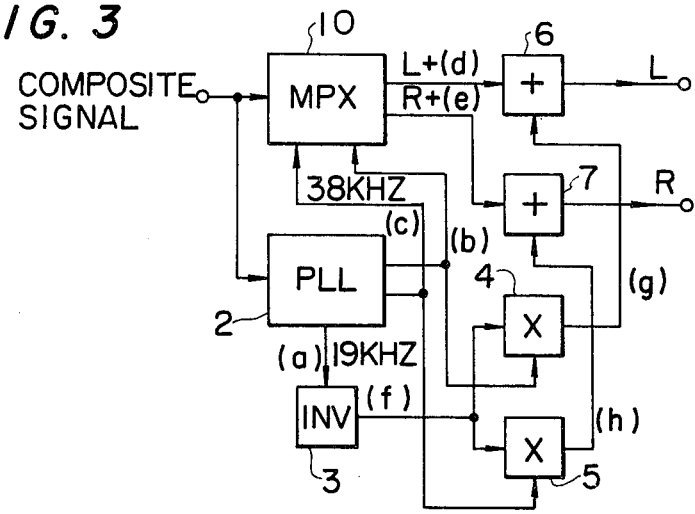
FIG. 3 shows a block diagram illustrating an embodiment of a pilot signal cancellation system for an FM multiplex demodulator according to this invention.

A preferred embodiment of the invention, as shown in FIG. 3, comprises an MPLX demodulator 10 whose circuit is as shown in FIG. 1, a phase lock loop 2 (PLL 2) for deriving 38 KHz subcarrier signals of opposite phase and a 19 KHz pilot signal from the composite input signal, a phase inverter 3 for inverting the phase of the 19 KHz signal from PLL 2, multipliers 4 and 5 for individually multiplying the opposite phase subcarrier signals from PLL 2 by the phase-inverted 19 KHz signal from the inverter 3, an adder 6 for adding the output of the multiplier 4 to the demodulated "L" signal of the MPLX demodulator 10, and an adder 7 for adding the output of the multiplier 5 to the demodulated "R" signal thereof, the outputs of the adders 6 and 7 then being employed as the demodulated stereophonic output signals.

Figure 2A:
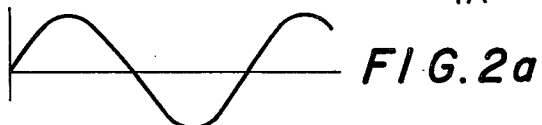
FIGS. 2(a)–2(h) show waveform diagrams of the pilot and subcarrier signals involved in this invention.
Figure 2B:
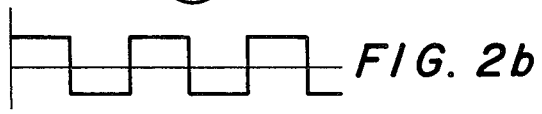
Figure 2C:
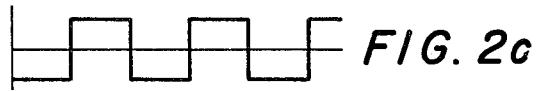
Figure 2D:
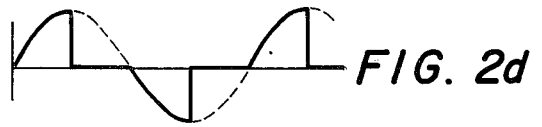
Figure 2E:
Figure 2F:

In the pilot signal component cancellation system thus described, pilot signal components, FIGS. 2(d) and 2(e), FIG. 2, appear in the "L" and "R" outputs of the MPLX demodulator 10, while the 19 KHz signal of PLL 2 is inverted into a signal, FIG. 2(f), whose phase is opposite to that of the pilot signal, FIG. 2(a). Signals of FIGS. 2(g) and 2(h) are the multiplication products of the signal of FIG. 2(f) with signals of FIGS. 2(b) and 2(c), respectively, and appear at the outputs of the multipliers 4 and 5. As can easily be seen, these signals, FIGS. 2(g) and 2(h) are equal in amplitude but opposite in phase to the signals, FIGS. 2(d) and 2(e), respectively. As will be readily understood, waveforms of FIGS. 2(g) and 2(h) are not pure multiplication products in the classical sense, but rather result from the waveforms of FIGS. 2(b) and 2(c) functioning as switching or gating signals with respect to the inverted pilot signal of FIG. 2(f).

Figure 2G:
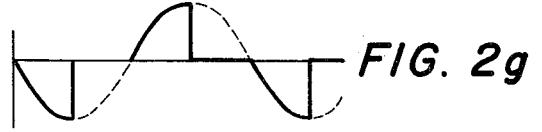
Figure 2H:
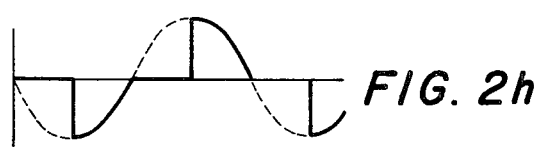

When the signal of FIG. 2(g) is added to the "L" output containing the signal of FIG. 2(d) by the adder 6, the FIGS. 2(g) and 2(d) signals cancel each other and the resulting final "L" signal thus contains no pilot signal components. Similarly, the FIGS. 2(e) and 2(h) signals cancel each other in the adder 7, whereby the final "R" signal is also devoid of pilot signal components.

Figure 4:
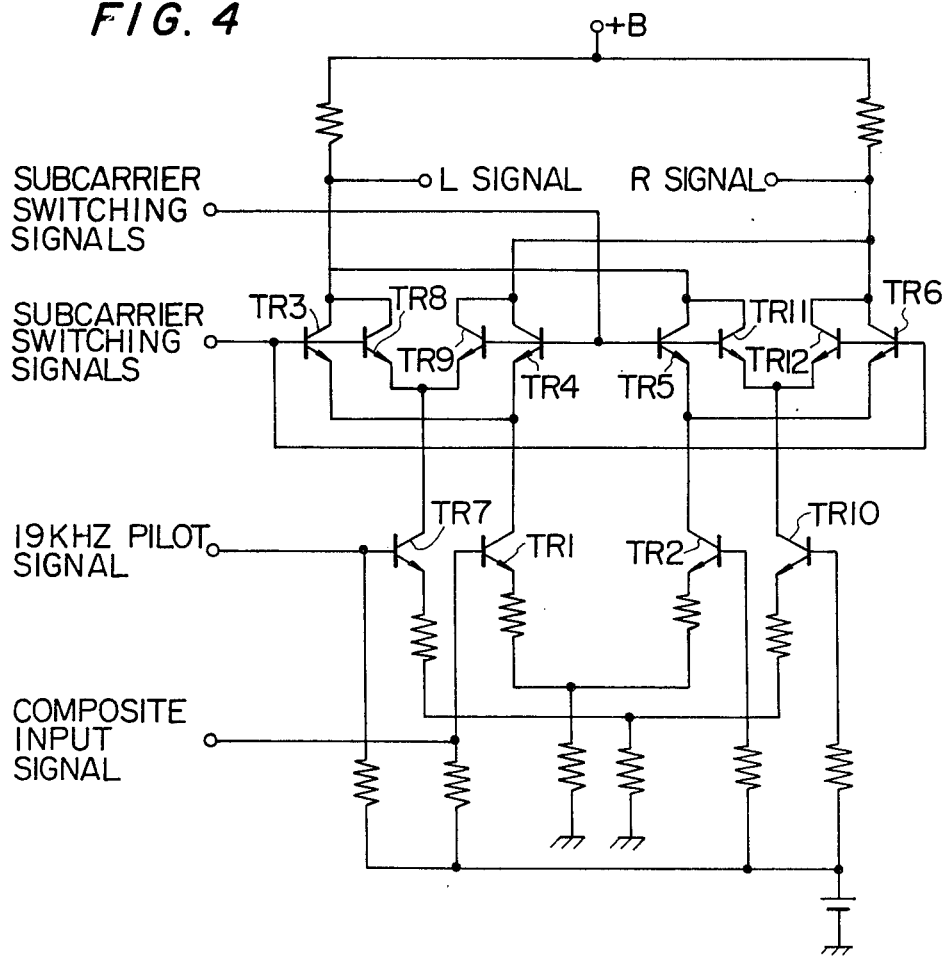
FIG. 4 shows a schematic circuit diagram of the essential elements of the pilot signal cancellation system of FIG. 3.

FIG. 4 is a schematic circuit diagram illustrating a more detailed embodiment of the invention including the MPLX demodulator 10, the multipliers 4 and 5, and the adders 6 and 7 shown in FIG. 3. The circuit shown in FIG. 4 comprises transistors TR1 through TR6 which form the MPLX demodulator shown in FIG. 1, transistors TR7, TR8 and TR9 which form the multiplier 4, and transistors TR10, TR11 and TR12 constituting the multiplier 5. The outputs of transistors TR3 through TR6 are connected respectively to the outputs of transistors TR8, TR9, TR11 and TR12, to obtain the nodal adders 6 and 7. It will be understood by one skilled in the art that a nodal adder is a circuit in which the output terminals of individual circuit elements are connected together so that the output signals of each of the individual circuit elements are superimposed on, or added to, one another. In this instance, the signals existing at nodes TR3–TR8, TR4–TR9, TR5–TR11 and TR6–TR12 consist of the output signals of multipliers 5 and 4 superimposed upon the left and right outputs, respectively, of the multiplexer 10.

When using the pilot signal component cancellation technique of this invention, the cutoff frequency of the low pass filter employed to remove harmonic components from the demodulated signals can be set at a value significantly higher than 15 KHz, whereby the high-frequency characteristics of the demodulated signals are vastly improved.

In the example described above, if the pilot signal is not completely or exactly sinusoidal, then some harmonic components may remain in the demodulation outputs. However, these harmonic components can be readily removed by the use of a simple filter.

The present invention has been described with reference to the elimination of pilot signal components from the demodulation outputs in a two-channel pilot tone system. As will be readily apparent, however, the concept of the invention is equally applicable to the elimination of such pilot signal components in a four-channel system.

What is claimed is:

1. In an FM multiplex demodulator including means for providing left (L) and right (R) channel output signals from a composite input signal in response to opposite phase switching signals derived from a pilot signal, means for removing unwanted pilot signal components from the L and R output signals, comprising:
  a. means for inverting the pilot signal,
  b. means for individually multiplying the inverted pilot signal by each of the opposite phase switching signals to produce signals equal in amplitude but opposite in phase to the unwanted pilot signal components, and
  c. means for individually adding the multiplication signals to the respective L and R output signals, whereby the unwanted pilot signal components are effectively cancelled.

2. A multiplex demodulator as defined in claim 1 further comprising a phase lock loop for deriving the pilot signal and the opposite phase switching signals from the composite input signal, and wherein the means for inverting comprises an inverter, the means for multiplying comprises a pair of multipliers and the means for adding comprises a pair of nodal adders.

3. In an FM multiplex demodulator wherein left (L) and right (R) channel output signals are derived from a composite input signal in response to opposite phase switching signals derived from a pilot signal, a method for removing unwanted pilot signal components from the L and R output signals, comprising the steps of:
  a. inverting the pilot signal,
  b. individually multiplying the inverted pilot signal by each of the opposite phase switching signals to produce signals equal in amplitude but opposite in phase to the unwanted pilot signal components, and
  c. individually adding the multiplication signals to the respective L and R output signals, whereby the unwanted pilot signal components are effectively cancelled.

* * * * *